United States Patent [19]

Hayakawa et al.

[11] 4,383,363
[45] May 17, 1983

[54] METHOD OF MAKING A THROUGH-HOLE CONNECTOR

[75] Inventors: Masao Hayakawa, Kyoto; Takamichi Maeda, Yamatokoriyama; Mituwo Oda, Osaka, all of Japan

[73] Assignee: Sharp Kabushiki Kaisha, Osaka, Japan

[21] Appl. No.: 163,634

[22] Filed: Jun. 27, 1980

Related U.S. Application Data

[62] Division of Ser. No. 937,759, Aug. 29, 1978, abandoned.

[30] Foreign Application Priority Data

Sep. 1, 1977 [JP] Japan .................................. 52-107705

[51] Int. Cl.³ .............................................. H05K 3/02
[52] U.S. Cl. ...................................... 29/847; 174/68.5; 339/17 B
[58] Field of Search ...................... 174/68.5; 29/846, 845, 29/852, 830, 530, 837; 339/17 F, 17 C, 17 E, 17 B

[56] References Cited

U.S. PATENT DOCUMENTS

| Re. 29,284 | 6/1977 | Shaheen et al. | 29/847 X |
| 3,040,119 | 6/1962 | Granzow . | |
| 3,077,511 | 2/1963 | Bohrer et al. | 339/17 E X |
| 3,311,966 | 4/1967 | Shaheen et al. | 29/530 X |
| 3,335,489 | 8/1967 | Grant | 29/530 X |
| 3,436,819 | 4/1969 | Lunine | 29/852 X |
| 3,561,110 | 2/1971 | Feulner et al. . | |
| 3,600,263 | 8/1971 | Lapitz . | |
| 3,601,523 | 8/1971 | Arndt . | |
| 3,895,435 | 7/1975 | Turner et al. | 29/852 |
| 4,050,756 | 9/1977 | Moore | 29/845 X |

OTHER PUBLICATIONS

IBM Tech. Discl. Bull. vol. 11, No. 8, Jan. 1969, p. 992 by T. L. Ellis.

Primary Examiner—Carl E. Hall
Assistant Examiner—Carl J. Arbes
Attorney, Agent, or Firm—Birch, Stewart, Kolasch & Birch

[57] ABSTRACT

A conductive paste is disposed in a through hole to provide communication between wiring patterns formed on both of the major surfaces of an insulator substrate. Conductive layers integral with the wiring patterns are formed on the both major surfaces of the insulator substrate so that the conductive layers extend across the through hole. The conductive layers make contact with the conductive paste disposed in the through hole and function to enclose the both ends of the conductive paste.

8 Claims, 7 Drawing Figures

METHOD OF MAKING A THROUGH-HOLE CONNECTOR

This application is a divisional of copending application Ser. No. 937,759, filed on Aug. 29, 1978, now abandoned.

BACKGROUND OF THE INVENTION

The present invention relates to a through hole connector which provides electrical communication between wiring patterns formed on two opposing major surfaces of an insulator circuit board.

In the conventional circuit board which carries wiring patterns formed on its two opposing major surfaces, through holes are formed at desired positions after conductive layers are formed on the entire surface of the opposing major surfaces of the circuit board. Inner surfaces of the thus formed through holes are coated with plated layers through the use of a chemical plating method or a chemical/electrical plating method, thereby providing electrical communication between the conductive layers formed on the two major surfaces with each other via the plated layers.

The through holes are formed through the use of a drilling method or a punching method. Therefore, there is the possibility that the circuit board or the conductive layers become distorted during the formation of the through holes. The thus formed distortion will adversely influence the formation of the plated layers so that an effective electrical connection can not be achieved between the two conductive layers. In addition, fine wiring patterns can not be formed near the through holes due to the distortion of the conductive layers.

Thereafter, the conductive layers are shaped in a desired configuration to obtain wiring patterns formed on both of the major surfaces of the circuit board. In the conventional system, a liquid photo-resist can not be employed because of the through holes formed in the circuit board. That is, the wiring patterns are formed, in the conventional system, through the use of a dry film or a resist sheet. Accordingly, fine wiring patterns can not be obtained because a minimum requirement in the thickness of the resist sheet.

Another example of prior art through hole connectors is disclosed in U.S. Pat. No. 3,601,523 "THROUGH HOLE CONNECTORS" by Lloyd G. Arndt, issued on Aug. 24, 1971, wherein a conductive adhesive is disposed in the through holes for providing electrical communication between the conductive layers formed on both of the major surfaces of the circuit board. In the device of U.S. Pat. No. 3,601,523, the through holes are formed after the conductive layers are formed on both of the major surfaces of the circuit board and, therefore, there is a possibility that the conductive layers will become distorted near the through holes. Moreover, in U.S. Pat. No. 3,601,523, electrical communication between the conductive layer and the conductive adhesive is achieved only through the use of the thickness of the conductive layer. In addition, the conductive adhesive is exposed to the ambience. Therefore, the shaping of the wiring patterns must be conducted through the use of a dry film or a resist sheet.

OBJECTS AND SUMMARY OF THE INVENTION

Accordingly, an object of the present invention is to provide a through hole connector which ensures stable electrical communication between conductive layers formed on both major surfaces of a circuit board.

Another object of the present invention is to provide a through hole connector which is suited for fine wiring patterns.

Still another object of the present invention is to provide a through hole connector including a conductive adhesive which is not exposed to the ambience.

Yet another object of the present invention is to provide a through hole connector for providing electrical communication between the conductive layers formed on both major surfaces of a flexible thin-film circuit substrate.

A further object of the present invention is to provide a through hole connector suited for mass production.

It is still a further object of the invention to produce a through hole connector while retaining each major surface of the circuit board substantially flat.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a through hole is first formed in an insulator substrate, and a conductive paste is introduced into the through hole. Thereafter, conductive layers are formed on both major surfaces of the insulator substrate in such a manner that the conductive layers completely cover both of the major surfaces of the insulator substrate inclusive of both ends of the conductive paste disposed in the through hole. Since the entire surface is covered by the conductive layer, a photo etching method can be employed to shape wiring patterns. That is, fine wiring patterns can be formed.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

FIGS. 1(A) through 1(D) show fabrication steps of one embodiment of the through hole connector of the present invention.

Figure 1:
FIGS. 1(A) through 1(D) are sectional views of the fabrication steps of one embodiment of a through hole connector of the present invention.
Figure 1:
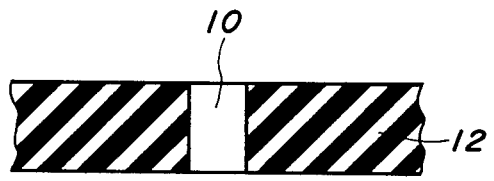
Figure 1:
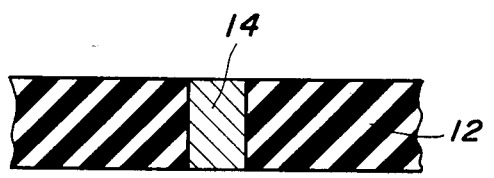
Figure 1:
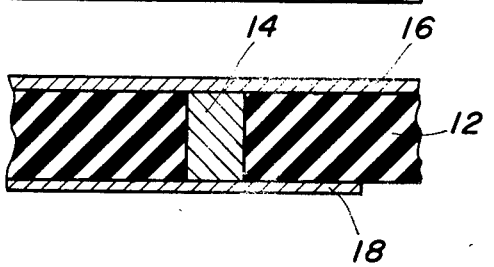

A through hole 10 is formed in an insulator substrate 12 at a desired position as shown in FIG. 1(B) through the use of a drilling method or a punching method. The insulator substrate 12 can be a rigid circuit board or a flexible thin-film substrate. Thereafter, a conductive paste 14 is introduced into the through hole 10 as shown in FIG. 1(C). Conductive layers 16 and 18 are formed on both major surfaces of the insulator substrate 12 in such a manner that the conductive layers 16 and 18 substantially cover the entire surfaces of the major surfaces of the insulator substrate 12 inclusive of both ends of the conductive paste 14 as shown in FIG. 1(D). That is, the upper conductive layer 16 and the lower conductive layer 18 extend across the through hole 10 and are in electrical communication with each other through the conductive paste 14. The conductive layers 16 and 18 can be formed by either attaching a copper film to the substrate or plating a copper layer on the substrate. Thereafter, the conductive layers 16 and 18 are shaped in a desired configuration, to obtain the wiring patterns, through the use of a photo-resist etching method.

Since the through hole 10 is formed in the insulator substrate 12 before formation of the conductive layers 16 and 18, the conductive layers 16 and 18 will not be distorted. Stable electrical connection is achieved between the upper conductive layer 16 and the bottom conductive layer 18, because the conductive paste 14 is filled in the through hole 10 and both ends of the conductive paste 14 are held in contact with the conductive layers 16 and 18. In addition, since the conductive past 14 is covered by the conductive layers 16 and 18, a liquid photo-resist or a photo etching method can be employed. Accordingly, fine wiring patterns can be formed.

The resistance value of the conductive paste 14 or the through hole connector is very small because the entire section is in contact with the conductive layers 16 and 18. The resistance value of the through hole connector can be calculated as follows:

$$R = \mu \times l/S$$

where:
R is the resistance value;
$\mu$ is the resistivity;
l is the length of the conductive paste 14; and
S is the sectional area of the conductive paste 14.

In case where the conductive layers 16 and 18 are made of copper films attached to the insulator substrate 12 through the use of an adhesive, the conductive paste 14, is preferably, slightly extruded from the surfaces of the insulator substrate 12 and the adhesive should not be painted on the both ends of the conductive paste 14 to ensure stable electrical communication.

Figure 2:
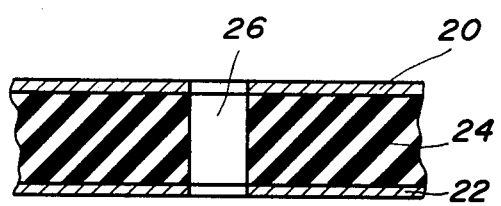
FIGS. 2(A) through 2(C) are sectional views of the fabrication steps of another embodiment of a through hole connector of the present invention.
Figure 2:
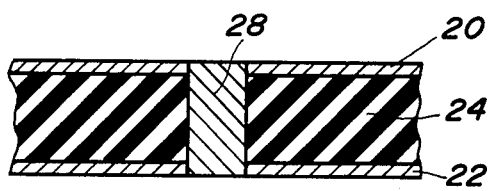
Figure 2:
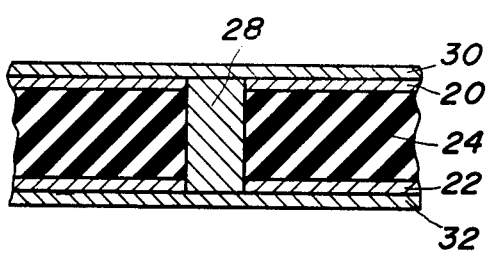

FIGS. 2(A) through 2(C) show fabrication steps of another embodiment of a through hole connector of the present invention.

In the embodiment of FIGS. 2(A) through 2(C), base conductive layers 20 and 22 are firstly formed on substantially the entire surface of an insulator substrate 24. A through hole 26 is formed in the substrate at a desired position as shown in FIG. 2(A). A conductive paste 28 is filled in the through hole 26 as shown in FIG. 2(B). Outer conductive layers 30 and 32 are formed on the base conductive layers 20 and 22 in such a manner that the outer conductive layers 30 and 32 cover substantially both of the entire major surfaces of the insulator substrate 24 inclusive of both ends of the conductive paste 28 as shown in FIG. 2(C). Thereafter, the conductive layers 20, 22, 30 and 32 are shaped in a desired configuration through the use of a photoresist etching method. The conductive layers 30 and 32 are in electrical communication with each other through the conductive layers 20 and 22 and the conductive paste 28.

In the case where insulator layers are disposed between the conductive layers 20 and 30, and conductive layers 22 and 32, respectively, a multilayer substrate carrying wiring patterns formed on both major surfaces thereof can be obtained.

[EXAMPLE]

The insulator substrate is a polyimide film, for example, "KAPTON" of 2 mil thickness manufactured by Du Pont Company. The conductive paste is a silver paste or a solder paste which can be added to the through hole through the use of a roller squeeze method or a screen printing method. The conductive paste is preferably "EPQTIC H-31" manufactured by Epoxy Technology Inc. The conductive paste can alternatively be introduced into the through hole by housing the conductive paste in a reservoir positioned below the insulator substrate while the through hole is formed by a drilling method. A tip end of the drill is dipped in the reservoir after formation of the through hole, and the conductive paste is filled in the through hole when the drill is returned to the initial state. The conductive layers are formed through the use of an electric plating method.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of making a through hole connector in an insulator circuit board substrate adapted to carry wiring patterns on both major surfaces thereof comprising the steps of:

providing an insulator substrate;
providing a reservoir of conductive paste adjacent said insulator substrate;
forming a through hole in said substrate between said major surfaces by penetrating said insulator substrate through the use of a penetrating means from the side of said substrate opposite said reservoir of conductive paste;
continuing the penetration of said penetrating means through said formed through hole and dipping said penetrating means into said reservoir of conductive paste, and
withdrawing said penetrating means from said reservoir and said through hole to thereby deposit conductive paste in said through hole to form a through hole connector;
forming conductive bridge layers on both of the major surfaces of said insulator substrate subsequent to the formation of said through hole and the deposition of said conductive paste therein in such a manner as to form substantially flat surfaces extending across substantially the entirety of each major surface of said substrate and across said through hole so that both end portions of said through hole connector are covered by and make direct contact with said conductive bridge layers; and
etching said conductive bridge layers so as to form wiring patterns on both of the major surfaces of said insulator substrate electrically connected through said through hole connector.

2. A method of making a through hole connector in an insulator circuit board substrate adapted to carry wiring patterns on both major surfaces thereof comprising the steps of:

providing an insulator substrate;

providing a reservoir of conductive paste adjacent said insulator substrate;

forming first conductive bridge layers on both of the major surfaces of said insulator substrate in such a manner as to substantially completely cover both of said major surfaces of said insulator substrate;

forming a through hole in said substrate and in said first conductive bridge layers by penetrating said insulator substrate and said first conductive bridge layers through the use of a penetrating means from the side of said substrate opposite said reservoir of conductive paste;

continuing the penetration of said penetrating means through said formed through hole and dipping said penetrating means into said reservoir of conductive paste, and withdrawing said penetrating means from said reservoir and said through hole to thereby fill said through hole with conductive paste to form a through hole connector;

forming second conductive bridge layers on substantially the entire surfaces of said first conductive bridge layers subsequent to the formation of said through hole and the deposition of said conductive paste therein in such a manner as to form substantially flat surfaces extending across substantially the entirety of each major surface of said substrate and across said through hole so that both end portions of said through hole connector are covered by said second conductive bridge layers and make direct contact with said first and second conductive bridge layers; and etching said first and second conductive bridge layers so as to form wiring patterns on both of the major surfaces of said insulator substrate electrically connected through said through hole connector.

3. The method of claims 1 or 2 wherein said conductive paste is deposited so as to completely fill said through hole.

4. The method of claim 1 wherein said conductive bridge layers are formed as copper films.

5. The method of claim 2 wherein said first and second conductive bridge layers are formed as copper films.

6. The method of claims 1 or 2 wherein the insulator substrate is a polyimide film.

7. The method of claims 1 or 2 wherein said insulator substrate is flexible.

8. The method of claims 1 or 2 wherein said conductive paste is a conductive adhesive.

* * * * *